United States Patent
Hase et al.

(10) Patent No.: US 9,013,837 B2
(45) Date of Patent: Apr. 21, 2015

(54) MAGNETORESISTIVE ELEMENT INCLUDING A CHANGING COMPOSITION AS DISTANCE INCREASES AWAY FROM AN INTERMEDIATE FILM, AND MAGNETIC HEAD WITH THE SAME

(71) Applicant: Kabushiki Kaisha Toshiba, Tokyo (JP)

(72) Inventors: Naoki Hase, Tokyo (JP); Masayuki Takagishi, Tokyo (JP); Susumu Hashimoto, Tokyo (JP); Shuichi Murakami, Tokyo (JP); Yousuke Isowaki, Yokohama (JP); Masaki Kado, Kamakura (JP); Hitoshi Iwasaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/206,175

(22) Filed: Mar. 12, 2014

(65) Prior Publication Data

US 2014/0334041 A1    Nov. 13, 2014

(30) Foreign Application Priority Data

May 9, 2013    (JP) .................................. 2013-099379

(51) Int. Cl.
*G11B 5/39*    (2006.01)
*G11B 5/147*    (2006.01)
(Continued)

(52) U.S. Cl.
CPC .............. *G01R 33/00* (2013.01); *G11B 5/3912* (2013.01); *G11B 5/3967* (2013.01); *G11B 2005/0024* (2013.01)

(58) Field of Classification Search
USPC ................. 360/110, 313, 324, 324.1, 324.11, 360/324.12, 324.2, 125.3
See application file for complete search history.

(56) References Cited

U.S. PATENT DOCUMENTS

| 8,537,497 B2 | 9/2013 | Nagasaka et al. |
| 8,564,904 B2 * | 10/2013 | Iwasaki et al. ............. 360/125.3 |
| 8,582,249 B2 | 11/2013 | Sapozhnikov et al. |

(Continued)

FOREIGN PATENT DOCUMENTS

| JP | 2007-142257 | 6/2007 |
| JP | 2012-230750 | 11/2012 |
| JP | 2013-048000 | 3/2013 |

OTHER PUBLICATIONS

Office Action mailed Jul. 11, 2014 in counterpart Japanese Patent Application No. 2013-099379 and English-laguage translation thereof.

(Continued)

*Primary Examiner* — Jefferson Evans
(74) *Attorney, Agent, or Firm* — Nixon & Vanderhye, P.C.

(57) ABSTRACT

A magnetoresistive element according to an embodiment includes: a magnetoresistance effect film including: a first magnetic film; a second magnetic film; and an intermediate film of a nonmagnetic material disposed between the first magnetic film and the second magnetic film, at least one of the first magnetic film and the second magnetic film being formed of a material expressed as $A_xB_{1-x}$ (65 at %≤x≤85 at %) where A is an alloy containing Co and at least one element selected from Fe and Mn, and B is an alloy containing Si or Ge, a Si concentration in the at least one of the first magnetic film and the second magnetic film decreasing and a Ge concentration increasing as a distance from the intermediate film increases.

14 Claims, 14 Drawing Sheets

(51) Int. Cl.
*G01R 33/00* (2006.01)
*G11B 5/00* (2006.01)

(56) References Cited

U.S. PATENT DOCUMENTS

| | | | |
|---|---|---|---|
| 8,773,822 B2* | 7/2014 | Matsubara et al. | 360/326 |
| 2005/0266274 A1* | 12/2005 | Hasegawa et al. | 428/828 |
| 2007/0115596 A1 | 5/2007 | Nakabayashi et al. | |
| 2009/0257151 A1* | 10/2009 | Zhang et al. | 360/324.2 |
| 2010/0072529 A1 | 3/2010 | Marukame et al. | |
| 2011/0007421 A1* | 1/2011 | Hara et al. | 360/234.3 |
| 2011/0043950 A1* | 2/2011 | Carey et al. | 360/320 |
| 2012/0241881 A1* | 9/2012 | Daibou et al. | 257/421 |
| 2013/0063841 A1* | 3/2013 | Braganca et al. | 360/244 |
| 2014/0063648 A1* | 3/2014 | Shiroishi et al. | 360/75 |
| 2014/0211338 A1* | 7/2014 | Iwasaki et al. | 360/70 |
| 2014/0233135 A1* | 8/2014 | Hashimoto et al. | 360/244 |

OTHER PUBLICATIONS

Carey, M.J. et al., "$Co_2MnGe$-based current-perpendicular-to-the-plane giant-magnetoresistance spin-valve sensors for recording head applications", Journal of Applied Physics, 109, 093912 (2011), 11 pages.

Kubota, T. et al., "Half-metallicity and Gilbert damping constant in $Co_2Fe_xMn_{1-x}Si$ Heusler alloys depending on the film composition", Applied Physics Letters, 94, 122504-1 (2009), 3 pages.

Mizuno, T. et al., "Transport and Magnetic Properties of CPP-GMR Sensor with CoMnSi Heusler Alloy", IEEE Transactions of Magnetics, vol. 44, No. 11, (Nov. 2008), pp. 3584-3587.

Nakatani, T.M. et al., "Bulk and interfacial scatterings in current-perpendicular-to-plane giant magnetoresistance with $Co_2Fe(Al_{0.5}Si_{0.5})$ Heusler alloy layers and Ag spacer", Applied Physics Letters 96, 212501, (2010), 3 pages.

Takahashi, Y.K. et al., "Large magnetoresistance in current-perpendicular-to-plane pseudospin valve using a $Co2Fe(Ge_{0.5}Ga_{0.5})$ Heusler alloy", Applied Physics Letters, 98, 102501, (2011) 3 pages.

* cited by examiner

| | COMBINATION OF FILMS (NUMBER IN PARENTHESES INDICATES THICKNESS IN EACH LAYER IN NANOMETER) | SATURATION MAGNETIZATION Bs AT HEAT TREATMENT TEMPERATURE [T] | | | COERCIVE FORCE Hc AT HEAT TREATMENT TEMPERATURE [Oe] | | |
|---|---|---|---|---|---|---|---|
| | | NO HEAT TREATMENT | 290°C | 350°C | NO HEAT TREATMENT | 290°C | 350°C |
| SAMPLE 1 | CFMS | 0.95 | 1.11 | 1.14 | 5 | 4 | 5 |
| SAMPLE 2 | CFMG | 1.06 | 1.23 | 1.27 | 7 | 10 | 73 |
| | EXPECTED VALUES OF [CFMS /CFMG] MULTILAYER FILM | 1.005 | 1.17 | 1.205 | 6 | 7 | 39 |
| SAMPLE 3 | CFMS+CFMG (CO-SPUTTER) | 0.95 | 1.09 | 1.13 | 6 | 8 | 17 |
| SAMPLE 4 | [CFMS(0.125)/CFMG(0.125)] | 1.07 | 1.3 | 1.35 | 5 | 5 | 7 |
| SAMPLE 5 | [CFMS(0.25)/CFMG(0.25)] | 1.16 | 1.32 | 1.36 | 5 | 6 | 11 |
| SAMPLE 6 | [CFMS(0.5)/CFMG(0.5)] | 1.12 | 1.27 | 1.31 | 6 | 6 | 8 |
| SAMPLE 7 | [CFMS(1)/CFMG(1)] | 1.12 | 1.25 | 1.25 | 6 | 7 | 8 |
| SAMPLE 8 | [CFMS(1.5)/CFMG(1.5)] | 0.97 | 1.11 | 1.13 | 5 | 6 | 6 |
| SAMPLE 9 | [CFMS(0.7)/CFMG(1.5)] | 0.95 | 1.11 | 1.23 | 5 | 6 | 6 |
| SAMPLE 10 | [CFMS(0.3)/CFMG(1.5)] | 1.26 | 1.34 | 1.36 | 5 | 6 | 8 |

FIG. 1

| | COMBINATION OF FILMS (NUMBER IN PARENTHESES INDICATES THICKNESS IN EACH LAYER IN NANOMETER) | SATURATION MAGNETIZATION Bs AT HEAT TREATMENT TEMPERATURE [T] | | | COERCIVE FORCE Hc AT HEAT TREATMENT TEMPERATURE [Oe] | | |
|---|---|---|---|---|---|---|---|
| | | NO HEAT TREATMENT | 290°C | 350°C | NO HEAT TREATMENT | 290°C | 350°C |
| SAMPLE 1 | CFMS | 0.95 | 1.11 | 1.14 | 5 | 4 | 5 |
| SAMPLE 2 | CFMG | 1.06 | 1.23 | 1.27 | 7 | 10 | 73 |
| SAMPLE11 | FC(0.25)/CFMG/FC(0.25) | 1.05 | 1.23 | 1.25 | 7 | 18 | 62 |
| SAMPLE12 | FC(0.5)/CFMG/FC(0.5) | 1.06 | 1.23 | 1.26 | 7 | 14 | 74 |
| SAMPLE13 | FC(1)/CFMG/FC(1) | 1.07 | 1.25 | 1.28 | 9 | 11 | 34 |
| SAMPLE14 | FC(2)/CFMG/FC(2) | 1.07 | 1.24 | 1.28 | 8 | 10 | 13 |
| SAMPLE15 | CFMS(0.25)/CFMG/CFMS(0.25) | 1.08 | 1.25 | 1.27 | 6 | 9 | 32 |
| SAMPLE16 | CFMS(0.5)/CFMG/CFMS(0.5) | 1.08 | 1.28 | 1.29 | 5 | 7 | 12 |
| SAMPLE17 | CFMS(1)/CFMG/CFMS(1) | 1.07 | 1.27 | 1.28 | 6 | 7 | 8 |
| SAMPLE18 | CFMS(2)/CFMG/CFMS(2) | 1.07 | 1.26 | 1.29 | 6 | 5 | 7 |

FIG. 2

| COMBINATION OF FILMS (NUMBER IN PARENTHESES INDICATES THICKNESS IN EACH LAYER IN NANOMETER) | SATURATION MAGNETIZATION Bs AT HEAT TREATMENT TEMPERATURE [T] | | | COERCIVE FORCE Hc AT HEAT TREATMENT TEMPERATURE [Oe] | | |
|---|---|---|---|---|---|---|
| | NO HEAT TREATMENT | 290°C | 350°C | NO HEAT TREATMENT | 290°C | 350°C |
| CFMS | 0.95 | 1.11 | 1.14 | 5 | 4 | 5 |
| CFMG | 1.06 | 1.23 | 1.27 | 7 | 10 | 73 |
| CFS | 1.22 | 1.26 | 1.26 | 7 | 7 | 10 |
| CFG | 1.22 | 1.31 | 1.36 | 9 | 10 | 35 |
| CMS | 0.55 | 1.08 | 1.05 | 7 | 15 | 40 |
| CMG | 0.5 | 1.05 | 1.02 | 7 | 20 | 85 |
| EXPECTED VALUES OF [CFMS/CFMG] MULTILAYER FILM | 1.005 | 1.17 | 1.205 | 6 | 7 | 39 |
| EXPECTED VALUES OF [CFS/CFG] MULTILAYER FILM | 1.22 | 1.285 | 1.31 | 8 | 8.5 | 22.5 |
| EXPECTED VALUES OF [CFS/CFMG] MULTILAYER FILM | 1.14 | 1.245 | 1.265 | 7 | 8.5 | 41.5 |
| EXPECTED VALUES OF [CFMS/CFG] MULTILAYER FILM | 1.085 | 1.21 | 1.25 | 7 | 7 | 20 |
| EXPECTED VALUES OF [CFS/CMS] MULTILAYER FILM | 0.86 | 1.155 | 1.14 | 7 | 13.5 | 47.5 |
| EXPECTED VALUES OF [CMS/CFG] MULTILAYER FILM | 0.885 | 1.195 | 1.205 | 8 | 12.5 | 37.5 |
| EXPECTED VALUES OF [CMS/CMG] MULTILAYER FILM | 0.525 | 1.065 | 1.035 | 7 | 17.5 | 62.5 |
| [CFMS(0.5)/CFMG(0.5)] | 1.12 | 1.27 | 1.31 | 6 | 6 | 8 |
| [CFS(0.5)/CFG(0.5)] | 1.37 | 1.42 | 1.42 | 8 | 9 | 16 |
| [CFS(0.5)/CFMG(0.5)] | 1.26 | 1.3 | 1.34 | 6 | 8 | 15 |
| [CFMS(0.5)/CFG(0.5)] | 1.31 | 1.41 | 1.4 | 6 | 6 | 9 |
| [CFS(0.5)/CMS(0.5)] | 1.18 | 1.29 | 1.33 | 6 | 6 | 9 |
| [CMS(0.5)/CFG(0.5)] | 1.1 | 1.23 | 1.3 | 7 | 15 | 34 |
| [CMS(0.5)/CMG(0.5)] | 0.81 | 1.15 | 1.18 | 7 | 16 | 70 |

FIG. 3

| COMBINATION OF FILMS (NUMBER IN PARENTHESES INDICATES THICKNESS IN EACH LAYER IN NANOMETER) | SATURATION MAGNETIZATION Bs AT HEAT TREATMENT TEMPERATURE [T] | | | COERCIVE FORCE Hc AT HEAT TREATMENT TEMPERATURE [Oe] | | |
|---|---|---|---|---|---|---|
| | NO HEAT TREATMENT | 290°C | 350°C | NO HEAT TREATMENT | 290°C | 350°C |
| CFMS | 0.95 | 1.11 | 1.14 | 5 | 4 | 5 |
| CFMG#1 ((Ge:19 at%)) | 1.06 | 1.23 | 1.27 | 7 | 10 | 73 |
| CFMG#2 ((Ge:25 at%)) | 0.94 | 1 | 1.15 | 6 | 10 | 81 |
| EXPECTED VALUES OF [CFMS/CFMG#1] MULTILAYER FILM | 1.005 | 1.17 | 1.205 | 6 | 7 | 39 |
| EXPECTED VALUES OF [CFMS/CFMG#2] MULTILAYER FILM | 0.945 | 1.055 | 1.145 | 5.5 | 7 | 43 |
| [CFMS(0.5)/CFMG#1(0.5)] | 1.12 | 1.27 | 1.31 | 6 | 6 | 8 |
| [CFMS(1)/CFMG#1(1)] | 1.12 | 1.25 | 1.25 | 6 | 7 | 8 |
| [CFMS(0.5)/CFMG#2(0.5)] | 0.99 | 1.14 | 1.23 | 6 | 6 | 8 |
| [CFMS(1)/CFMG#2(1)] | 1.02 | 1.18 | 1.24 | 6 | 6 | 10 |

FIG. 5

| COMBINATION OF FILMS (NUMBER IN PARENTHESES INDICATES THICKNESS IN EACH LAYER IN NANOMETER) | SATURATION MAGNETIZATION Bs AT HEAT TREATMENT TEMPERATURE [T] | | | COERCIVE FORCE Hc AT HEAT TREATMENT TEMPERATURE [Oe] | | |
|---|---|---|---|---|---|---|
| | NO HEAT TREATMENT | 290°C | 350°C | NO HEAT TREATMENT | 290°C | 350°C |
| $(CoFe)_{85}Si_{15}$ | 1.4 | 1.47 | 1.47 | 13 | 12 | 14 |
| $(CoFe)_{85}Ge_{15}$ | 1.34 | 1.41 | 1.4 | 14 | 15 | 24 |
| $(CoFe)_{80}Si_{20}$ | 1.38 | 1.45 | 1.44 | 13 | 13 | 14 |
| $(CoFe)_{80}Ge_{20}$ | 1.32 | 1.4 | 1.4 | 15 | 14 | 22 |
| $(CoFe)_{70}Si_{30}$ | 1.19 | 1.22 | 1.24 | 13 | 15 | 16 |
| $(CoFe)_{70}Ge_{30}$ | 1.17 | 1.2 | 1.23 | 15 | 16 | 26 |
| $(CoFe)_{65}Si_{35}$ | 1.12 | 1.16 | 1.2 | 13 | 15 | 18 |
| $(CoFe)_{65}Ge_{35}$ | 1.13 | 1.18 | 1.2 | 13 | 16 | 37 |
| EXPECTED VALUES OF $[(CoFe)_{85}Si_{15}/(CoFe)_{85}Ge_{15}]$ MULTILAYER FILM | 1.37 | 1.44 | 1.435 | 13.5 | 13.5 | 19 |
| EXPECTED VALUES OF $[(CoFe)_{80}Si_{20}/(CoFe)_{80}Ge_{20}]$ MULTILAYER FILM | 1.35 | 1.425 | 1.42 | 14 | 13.5 | 18 |
| EXPECTED VALUES OF $[(CoFe)_{70}Si_{30}/(CoFe)_{70}Ge_{30}]$ MULTILAYER FILM | 1.18 | 1.21 | 1.235 | 14 | 15.5 | 21 |
| EXPECTED VALUES OF $[(CoFe)_{65}Si_{35}/(CoFe)_{65}Ge_{35}]$ MULTILAYER FILM | 1.125 | 1.165 | 1.2 | 13 | 15.5 | 27.5 |
| $[(CoFe)_{85}Si_{15}(0.5)/(CoFe)_{85}Ge_{15}(0.5)]$ | 1.39 | 1.47 | 1.5 | 13 | 13 | 14 |
| $[(CoFe)_{80}Si_{20}(0.5)/(CoFe)_{80}Ge_{20}(0.5)]$ | 1.39 | 1.44 | 1.46 | 13 | 12 | 15 |
| $[(CoFe)_{70}Si_{30}(0.5)/(CoFe)_{70}Ge_{30}(0.5)]$ | 1.18 | 1.22 | 1.24 | 14 | 14 | 17 |
| $[(CoFe)_{65}Si_{35}(0.5)/(CoFe)_{65}Ge_{35}(0.5)]$ | 1.15 | 1.2 | 1.22 | 13 | 14 | 17 |

FIG. 6

| ELEMENT | COMBINATION OF FILMS (NUMBER IN PARENTHESES INDICATES THICKNESS IN EACH LAYER IN NANOMETER) | AREA × RESISTANCE CHANGE dRA [mΩ μm2] | | |
|---|---|---|---|---|
| | | NO HEAT TREATMENT | 290°C | 350°C |
| SAMPLE 21 | CFMS(5) | 2.1 | 4 | 5.2 |
| SAMPLE 22 | CFMG(5) | 2.5 | 4 | 3 |
| SAMPLE 23 | [CFMS(0.5)/CFMG(0.5)](5) | 3.9 | 6.6 | 8.6 |
| SAMPLE 24 | CFMS(0.5)/CFMG(4)/CFMS(0.5) | 3.7 | 6.3 | 7.1 |
| SAMPLE 25 | CFMG(0.5)/CFMS(4)/CFMG(0.5) | 3.5 | 4 | 3.8 |
| SAMPLE 26 | CFMS(0.5)/[CFMG(0.7)/CFMS(0.3)](4)/CFMS(0.5) | 4.0 | 6.8 | 8.7 |
| SAMPLE 27 | [CFMS+CFMG (CO-SPUTTER)](5) | 2.2 | 4 | 4.5 |
| SAMPLE 28 | [CFMS(0.125)/CFMG(0.125)](5) | 4.1 | 6.8 | 8.8 |
| SAMPLE 29 | [CFMS(0.25)/CFMG(0.25)](5) | 4.0 | 6.9 | 9.0 |

FIG. 7

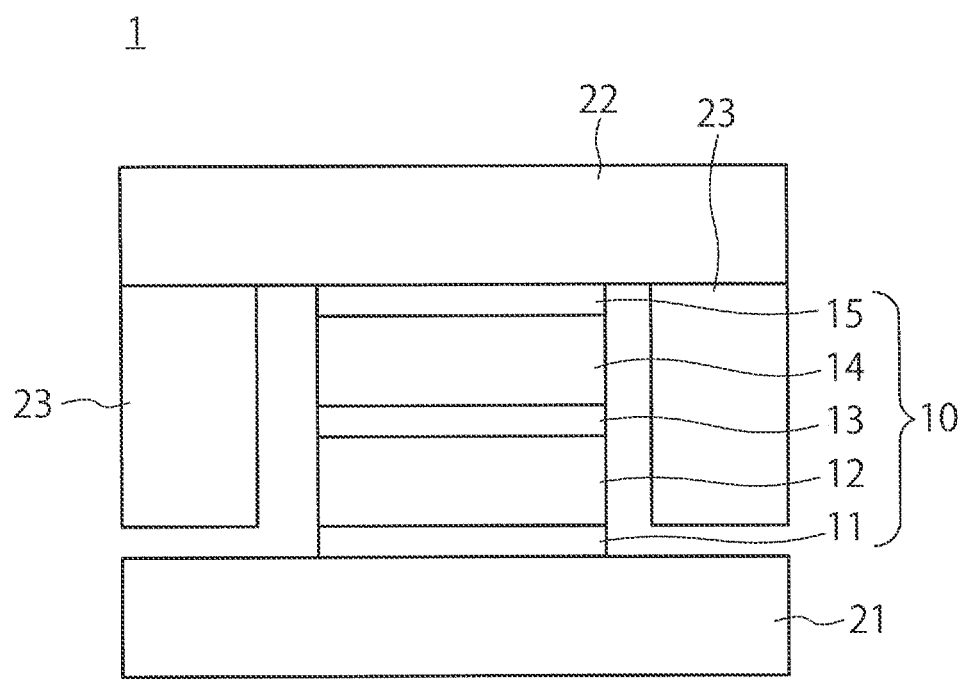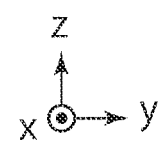
FIG. 9

US 9,013,837 B2

MAGNETORESISTIVE ELEMENT INCLUDING A CHANGING COMPOSITION AS DISTANCE INCREASES AWAY FROM AN INTERMEDIATE FILM, AND MAGNETIC HEAD WITH THE SAME

CROSS REFERENCE TO RELATED APPLICATIONS

This application is based upon and claims the benefit of priority from prior Japanese Patent Application No. 2013-099379 filed on May 9, 2013 in Japan, the entire contents of which are incorporated herein by reference.

FIELD

Embodiments described herein relate generally to a magnetoresistive element, a magnetic head, a magnetic recording and reproducing apparatus, and a method of manufacturing a magnetoresistive element.

BACKGROUND

In a magnetic recording and reproducing apparatus, data stored in a magnetic recording medium such as a hard disk drive is read by a magnetoresistive magnetic head. As the recording density of the magnetic recording medium is improved, a reading sensor (magnetoresistive magnetic head) that is highly sensitive, i.e., has a high resistance change rate, and operates with a low noise is needed. A magnetic material having a high resistance change rate is also needed for spintronics-related magnetoresistive elements such as a spin transistor and a magnetic random access memory (MRMA).

A magnetoresistive element containing a Heusler alloy with an ordered crystal structure in a ferromagnetic layer is expected to have a high resistance change rate in principle. Research and development of Heusler alloys to be applied to spintronics-related magnetoresistive elements such as a reproducing element of a magnetic head, a spin transistor, and an MRMA is being actively performed. However, a heat treatment at a high temperature of 500° C. or more is said to be required to order crystal. This makes it difficult to apply the Heusler alloys to magnetoresistive elements because of the deterioration thereof caused by thermal diffusion. If a magnetic head is to be manufactured, an upper limit of the heat-treatment temperature is said to be about 300° C.

BRIEF DESCRIPTION OF THE DRAWINGS

FIG. 1 is a diagram showing a result of an experiment in which magnetic characteristics of Heusler multilayer films and Heusler monolayer films are measured.

FIG. 2 is a diagram showing a result of an experiment in which magnetic characteristics are measured in cases where a Heusler multilayer film is sandwiched by FeCo films and cases where it is sandwiched by Heusler alloy films.

FIG. 3 is a diagram showing a result of an experiment in which magnetic characteristics of various Heusler multilayer films and Heusler monolayer films containing Si and/or Ge are measured.

FIG. 5 is a diagram showing a result of an experiment in which magnetic characteristics of Heusler multilayer films and Heusler monolayer films, in which the Ge concentration is modulated, are measured.

FIG. 6 is a result of an experiment in which magnetic characteristics of magnetic alloy films and monolayer films of CoFeSi and CoFeGe are measured.

FIG. 7 is a diagram showing a result of an experiment in which magnetoresistance effects of Heusler multilayer films and Heusler monolayer films are measured.

FIG. 9 is a plan view of a reproducing unit of a magnetic head according to the first embodiment.

DETAILED DESCRIPTION

Figure 4:
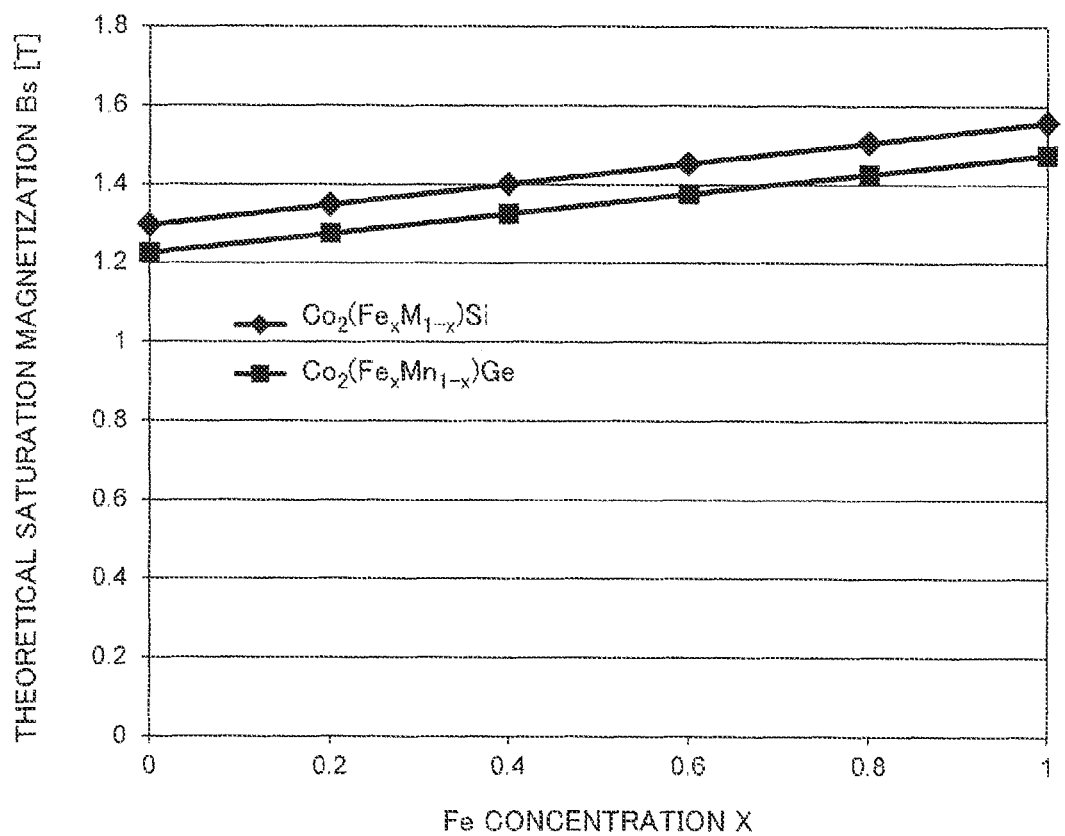
FIG. 4 is a diagram showing the relationship between the Fe concentration and the theoretical saturation magnetization Bs in a CFMS film and a CFMG film.

A magnetoresistive element according to an embodiment includes: a magnetoresistance effect film including: a first magnetic film; a second magnetic film; and an intermediate film of a nonmagnetic material disposed between the first magnetic film and the second magnetic film, at least one of the first magnetic film and the second magnetic film being formed of a material expressed as $A_xB_{1-x}$ (65 at %≤x≤85 at %) where A is an alloy containing Co and at least one element selected from Fe and Mn, and B is an alloy containing Si or Ge, a Si concentration in the at least one of the first magnetic film and the second magnetic film decreasing and a Ge concentration increasing as a distance from the intermediate film increases.

Embodiments will now be explained with reference to the accompanying drawings.

It should be noted that the drawings are schematic or conceptional, and the relationship between thickness and width of each part, and the ratio in size between parts do not necessarily match the actual ones. Furthermore, the same parts may be expressed in different sizes and ratios in different drawings.

It should also be noted that detailed explanation of an element that has already been described with reference to a drawing and has the same reference numerals may be arbitrarily omitted.

First, how the embodiments have been achieved will be described.

Heusler alloys will be studied below. A Heusler alloy contains at least two elements selected from the group consisting of Co, Fe, and Mn in the A-site, and Si or Ge in the B-site. The Si or Ge can be substituted by Al or Ga so that the proportion of Al or Ga is equal to or less than a half of the proportion of Si or Ge. The degree of ordering in a crystal in the Heusler alloy is improved through a high-temperature heat treatment. It is known that a magnetoresistive element with a high MR ratio can be obtained by using such a Heusler alloy to form a magnetic layer.

Heusler alloys have several crystal structures such as A2, B2, and $L2_1$. The saturation magnetization Bs of the A2 structure, in which elements are arranged completely in a disordered manner, is low. However, the saturation magnetization increases as the degree of ordering in the crystal improves. Therefore, the saturation magnetization Bs serves as an indicator of the degree of ordering in the crystal of the Heusler alloy. As a result, it serves as an indicator of the improvement in MR ratio.

On the other hand, the coercive force Hc serves as an indicator of the stability of the Heusler alloy. If interdiffusion is caused between a Heusler alloy layer and an adjacent base layer by a heat treatment, for example, the Heusler alloy layer which would originally have a coercive force Hc of about 10 Oe or less becomes to have a higher coercive force Hc. The increase in coercive force Hc causes a malfunction of a reproducing head, and reduces the magnetoresistance effect caused by the deterioration of the Heusler alloy layer due to interdiffusion. This would lead to a decrease in MR ratio. While a reproducing head is manufactured, a heat treatment at a temperature of about 300° C. is performed. Accordingly, by checking the degree of coercive force Hc in each temperature level of heat treatment of the Heusler alloy layer, the heat resistance of the Heusler alloy layer can be checked.

In view of the aforementioned points, Samples 1 to 10 of magnetic alloy films each containing a Heusler alloy are prepared, and an experiment is performed in which the coercive force Hc is measured in a case a) where no heat treatment is performed, a case b) where a heat treatment is performed at a temperature of 290° C., and a case c) where a heat treatment is performed at a temperature of 350° C. FIG. 1 shows the result of such an experiment.

The magnetic alloy films used in this experiment are monolayer films formed of such materials as $Co_{50}(Fe_{0.4}Mn_{0.6})_{25}Si_{25}$ (hereinafter also referred to as "CFMS"), $Co_{53}(Fe_{0.4}Mn_{0.6})_{27}Ge_{19}$ (hereinafter also referred to as "CFMG"), $Co_{50}Fe_{25}Si_{25}$ (hereinafter also referred to as "CFS"), $Co_{50}Fe_{25}Ge_{25}$ (hereinafter also referred to as "CFG"), $Co_{50}Mn_{25}Si_{25}$ (hereinafter also referred to as "CMS"), and $CoMn_{25}Ge$ (hereinafter also referred to as "CMG"), or have multilayer structures obtained by stacking such monolayer films. The expression $Co_{50}(Fe_{0.4}Mn_{0.6})_{25}Si_{25}$ means that the proportion of Co is 50 atoms percent (at %), the proportion of Fe is 25 at %×0.4=10 at %, the proportion of Mn is 25 at %×0.6=15 at %, and the proportion of Si is 25 at %. Examples of the multilayer structures include CFMS/CFMG and CFS/CFG. The expression "A/B" means that a layer B is stacked on a layer A. Unless otherwise specified, the multilayer structure including magnetic alloy films is formed by stacking Ta layer (2)/Cu layer (2)/FeCo layer (1)/magnetic alloy film (2-20)/FeCo layer (0.5)/Cu layer (2)/Ta layer (2) on a monocrystalline Si substrate, where the numerals in parentheses mean thicknesses in the unit of nm.

The saturation magnetization Bs of each of Samples 3 to 10 is obtained by changing the thickness of the magnetic alloy film obtained by stacking the corresponding sample in a range of 2 to 20 nm, and calculating the saturation magnetization based on the gradient of each saturation magnetization depending on the thickness. The value of coercive force Hc is measured by setting the thickness of the magnetic alloy film to be 4 nm to 5 nm.

The numerals in parentheses in Samples 3 to 10 mean thicknesses of CFMG and CFMS in the unit of nm. The expected values in FIG. 1 of the [CFMS/CFMG] multilayer film are obtained by adding the values of the magnetic characteristics of the CFMS monolayer film in Sample 1 and the CFMG monolayer film in Sample 2 and dividing the obtained value by 2. If the saturation magnetization Bs of a film is higher than the expected saturation magnetization Bs of the [CFMS/CFMG] multilayer film, it indicates that the degree of ordering in the Heusler alloys in the film is more than expected from the monolayer films. Incidentally, if crystals of CFMS of Sample 1 and CFMG of Sample 2 shown in FIG. 1 are completely ordered (to have a complete $L2_1$ ordered crystal structure), the values of theoretical saturation magnetization Bs are 1.41 T and 1.33 T, respectively. The proportion of saturation magnetization Bs to the theoretical saturation magnetization in a CFMS monolayer film, a CFMG monolayer film (with 19 at % of Ge), in which the proportion of Ge is reduced from the Heusler proportion (25 at %), and a CFMG#2 monolayer film having the composition ratios $(Co_{51}(Fe_{0.4}Mn_{0.6})_{24}Ge_{25}$ (at %)) that substantially match those of the stoichiometric composition $(Co_{50}(Fe_{0.4}Mn_{0.6})_{25}Ge_{25}$ (at %)) of a Heusler alloy, i.e., saturation magnetization Bs/theoretical saturation magnetization of these monolayer films is 0.67 to 0.81 for the CFMS monolayer film, 0.80 to 0.95 for the CFMG monolayer film, and 0.71 to 0.86 for the CFMG#2 monolayer film. This means that the CFMG monolayer film and the CFMG#2 monolayer film have saturation magnetization closer to the theoretical saturation magnetization. It could be understood from this that a Heusler alloy containing Ge is easier to have ordered crystal than CFMS. The reason why CFMG has a higher saturation magnetization than CFMG#2 is considered to be that the less Ge concentration in CFMG leads to an increase in the proportions of magnetic elements Co, Fe.

The "CFMS+CFMG (co-sputter)" film of Sample 3 in FIG. 1 is obtained by sputtering different CFMS target and CFMG target simultaneously. In this case, the saturation magnetization Bs is less than the expected value regardless of whether a heat treatment is performed or not. Thus, this layer is not appropriate to obtain ordered crystal. Furthermore, this layer has a high coercive force Hc of 17 Oe after a heat treatment at a temperature of 350° C. Thus, the heat resistance of this layer is not satisfactory.

As can be understood from the values of the [CFMS/CFMG] multilayer films of Samples 4 to 10 in FIG. 1, if the thickness of the CFMS film is less than 1.5 nm, the saturation magnetization Bs exceeds the expected value. Although the values of the saturation magnetization Bs of Samples 8 and 9 are below the expected value in the case where no heat treatment is performed and the case where a heat treatment is performed at a temperature of 290° C., the values in the case where a heat treatment is performed at a temperature of 350° C. is higher than the expected value. Except for Sample 5, the values of the coercive force Hc are less than 10 Oe when a heat treatment is performed at a temperature of 350° C. Although the value of the coercive force Hc in Sample 5 is 11 Oe or more when a heat treatment is performed at a temperature of 350° C., the values thereof in the case where no heat treatment is performed, and the case where a heat treatment is performed at a temperature of 290° C. are lower than the expected value. Thus, a Heusler alloy multilayer film, in which the thickness of the CFMS film is from a monolayer level (very thin) to 1.5 nm, and CFMS films and CFMG films are alternately stacked, can have an ordered crystal, the degree of which is higher than that of a monolayer film or co-sputter film, regardless of the thickness of the CFMG film. The reason why a highly ordered crystal can be obtained is considered to be that, when a CFMG film, the crystal of which can be ordered more easily than the crystal of a CFMS film, is disposed next to a CFMS film to accelerate the ordering of the CFMS film, the thinner CFMS film is, the more easily the ordering thereof may be accelerated. It is assumed here that the thickness of the monolayer is 0.125 nm.

FIG. 2 shows a result of an experiment in which a Heusler multilayer film (CFMG film) is sandwiched by generally-obtained FeCo films (hereinafter also referred to as "FC" films) (Samples 11 to 14) and by CFMS Heusler alloy films (Samples 15 to 18) and magnetic characteristics of CFMG are measured. The saturation magnetization Bs does not greatly differs between the cases where the CFMG film is sandwiched by magnetic films containing CFMS or magnetic films containing FC. On the other hand, the coercive force Hc in the case where the CFMG film is sandwiched by the CFMS films is less than that in the case where the CFMG film is sandwiched by the FC films when a heat treatment is performed at a temperature of 290° C. or more. In particular, this effect becomes remarkable when the thickness of the CFMS films becomes 0.5 nm or more. This experimental result indicates that a Heusler alloy film, which is not highly resistant to heat, is preferably sandwiched by Heusler alloy films that are highly resistant to heat such as CFMS films, rather than FeCo alloy films, to improve the heat resistance of the Heusler alloy film FIG. 3 is a diagram showing a result of an experiment in which magnetic characteristics of Heusler multilayer films and Heusler monolayer films containing Si or Ge in addition to the CFMS film and the CFMG film shown in FIG. 1 are measured. FIG. 4 is a diagram showing the relationship between the Fe concentration and the theoretical saturation magnetization Bs in each of the CFMS film and the CFMG film. The expected values of the Heusler multilayer films in FIG. 3 are obtained in the same manner as those in FIG. 1. It can be understood that if Heusler alloy films containing Si and Heusler alloy films containing Ge are alternately stacked, the saturation magnetization Bs exceeds the expected value obtained from the monolayer films regardless of whether the Heusler alloy films are based on Fe or Mn. It can also be understood that if the coercive force Hc of each monolayer film of Heusler alloy forming a multilayer film (for example, [CMS/CFG] or [CMS/CMG]) is large, the coercive force Hc of the multilayer film after a heat treatment is also large.

On the other hand, it is proved that if at least one of the films of the multilayer film is formed of a Heusler alloy, the coercive force Hc of which is not increased by a heat treatment (i.e., a Heusler alloy that is highly heat resistant), an increase in coercive force Hc of the multilayer film can be suppressed even if the heat resistance of the Heusler alloy of the other film is not so good. Thus, this experiment indicates that a highly ordered crystal can be obtained in a multilayer film including a Heusler alloy film containing Si and a Heusler alloy film containing Ge, and that even if a Heusler alloy film that is not satisfactorily heat resistant, which tends to cause interdiffusion during a heat treatment, is used, a Heusler multilayer film that is satisfactorily heat resistant can be obtained if such a Heusler alloy film is stacked with another film that is satisfactorily heat resistant.

Furthermore, it is reported that if a half or less of Si in CoFeSi is substituted by Al, and if part of Ge in CoFeGe is substituted by Ga, similarly ordered alloys can be formed by a heat treatment (for example, APPLIED PHYSICS LETTERS 96, 212501 (2010), APPLIED PHYSICS LETTERS 98, 152501 (2011)). It is considered that the Heusler alloy films used in the embodiments described below may have the same effect if a half or less of Si or Ge is substituted by Al or Ga.

FIG. 5 is a diagram showing a result of an experiment in which magnetic characteristics are measured of Heusler alloy monolayer films of CFMS and CFMG with different Ge concentrations and multilayer films each including a CFMG Heusler alloy film and one of such CFMG films. The expected values of the [CFMS/CFMG#1] multilayer film and the [CFMS/CFMG#2] multilayer film each having a different Ge concentration shown in FIG. 5 are obtained in the same manner as the case of FIG. 1. The Ge concentration of the CFMG#1 film shown in FIG. 5 is 19 at %, which is less than the stoichiometric composition, 25 at %, of the CFMG Heusler alloy, and the Ge concentration of the CFMG#2 film is 25 at %, which is substantially the same as that of the stoichiometric composition of the Heusler alloy.

It can be understood from the experimental result of the CFMG#1 monolayer film and the CFMG#2 monolayer film that the saturation magnetization Bs of the CFMG#1 film, in which the Ge concentration is lower, is more likely to increase. The reason for this is considered to be an increase in the Co and Fe concentrations caused by a decrease in the Ge concentration. On the other hand, the changes in coercive force Hc caused by heat treatments does not considerably differ between the CFMG#1 film and the CFMG#2 film. For both the films, a considerable increase in the coercive force Hc can be found in a heat treatment at a temperature of 350° C.

FIG. 5 shows that the saturation magnetization Bs of each multilayer film including the aforementioned films exceeds the expected value, and that therefore ordered crystal can be easily obtained in each multilayer film. FIG. 5 also shows that the coercive force Hc of each multilayer film is 10 Oe or less after a heat treatment at a temperature of 350° C., and thus the multilayer films have a good heat resistance. Thus, this experiment indicates that, regardless of whether the Ge concentration is high or low, highly-ordered crystal and good heat resistance can be obtained by alternately stacking the Heusler alloy films shown in FIGS. 1 to 3. However, the Bs-increasing effect disappears when the Ge concentration is 15% or less.

A Heusler alloy having a high MR ratio even if the concentration of B-site element, Si or Ge, is 30% is reported (JOURNAL OF APPLIED PHYSICS 109, 093912 (2011), IEEE TRANSACTIONS ON MAGNETICS, VOL. 44, NO. 11, NOVEMBER 2008). However, if the Ge concentration exceeds 35%, the crystal structure becomes unstable, and the Bs-increasing effect disappears. Thus, the crystal structure of a high MR ratio Heusler alloy is stable when the concentration of the B-site element is 15% or more and 35% or less.

The examples in FIGS. 1 to 3 have A-site elements that have composition ratios near those of the ideal Heusler alloy composition ratios, i.e., 2/3 for Co and 1/3 for Fe and Mn.

However, even if the composition ratios in the A-site are different from those of a Heusler alloy, the temperature for ordering crystal in the ferromagnetic layer can be lowered. FIG. 6 shows a result of an experiment indicating this. In FIG. 6, the magnetic characteristics of magnetic alloy films such as $(CoFe)_{85}Si_{15}$, $(CoFe)_{80}Si_{20}$, $(CoFe)_{70}Si_{30}$, $(CoFe)_{65}Si_{35}$, $(CoFe)_{85}Ge_{15}$, $(CoFe)_{80}Ge_{20}$, $(CoFe)_{70}Ge_{30}$, and $(CoFe)_{65}Ge_{35}$, in which the composition ratios of Co and Fe in the A-site are adjusted to be 1:1, and Si or Ge is added thereto, and the magnetic characteristics of multilayer films including such magnetic alloy films are compared. The expected values of the multilayer films shown in FIG. 6 are obtained in the same manner as those in FIG. 1. Although the Bs-increasing effect in these films is weaker than that in the Heusler alloy films shown in FIG. 1, the saturation magnetization Bs in each film is greater than that of the expected value. Thus, even if the composition ratios in the A-site elements are different from those of the Heusler composition, the effect of accelerating the ordering can be obtained by stacking these layers. It can be confirmed that the coercive force Hc of the films including Ge increases after a heat treatment at a temperature of 350° C. However, as in the cases of the aforementioned examples, the increase in coercive force Hc during a heat treatment at a temperature of 350° C. can be suppressed by stacking magnetic alloy films containing Si or Ge. Thus, FIG. 6 shows that even if the composition ratios in the A-site elements are different from those of a Heusler alloy, ordered crystal can be obtained and the heat resistance can be improved by a multilayer structure including a magnetic alloy film containing Si and a magnetic alloy film containing Ge. As can be understood from FIG. 6, the saturation magnetization Bs of a multilayer film including a magnetic alloy film of $(CoFe)_xSi_{1-x}$ (65 at %≤x≤85 at %) and a magnetic alloy film of $(CoFe)_xGe_{1-x}$ (65 at %≤x≤85 at %) becomes more than the expected value, and the coercive force thereof is less than the expected value. Thus, such a multilayer film has an effect of accelerating the ordering of crystal, and an effect of improving the heat resistance.

It is known that a magnetoresistive element including a spacer of MgO disposed between two magnetic layers has a high MR ratio even if Fe in the A-site is substituted by Mn. From the foregoing, it can be understood that even if a part or the whole of Fe in the A-site is substituted by Mn, an effect of accelerating the ordering of crystal, and an effect of improving the heat resistance can be obtained. For example, a multilayer film including a magnetic alloy film of $(CoMn)_xSi_{1-x}$ (65 at %≤x≤85 at %) and a magnetic alloy film of $(CoMn)_xGe_{1-x}$ (65 at %≤x≤85 at %) can be used. If the A-site of the alloy contains Co and at least one element selected from the group consisting of Fe and Mn, a multilayer structure including a magnetic alloy film of $A_xSi_{1-x}$ (65 at %≤x≤85 at %) and a magnetic alloy film of $A_xGe_{1-x}$ (65 at %≤x≤85 at %) can be used. The composition ratios of Co and Fe or Mn in the A-site are preferably set such that the composition ratio of Co is higher than that of Fe or Mn, and is about 50 at % (for example, 45 at % or more and 55 at % or less). The reason for this is that the Co concentration in the Co-based Heusler alloy based on the stoichiometric ratio is 50 at %.

FIG. 7 is a result of an experiment in which Sample 21 to 27 including a CFMS Heusler alloy monolayer, a CFMG Heusler alloy monolayer, and multilayer films obtained by stacking these Heusler alloy layers are prepared, magnetoresistive elements each including one of these samples are prepared, and the MR values of these magnetoresistive element are measured. In FIG. 7, the MR value is expressed as area× resistance change dRA. The MR value is evaluated such that a magnetoresistance effect film of a Ta layer (2 nm)/a base layer of Cu (2 nm)/a Heusler alloy layer shown in FIG. 7/a FC layer/a Cu intermediate layer (3 nm)/a FC layer/a Heusler alloy layer shown in FIG. 7/a Cu layer (1 nm)/a Ru cap layer is formed on a lower electrode and patterned in a shape of 100 nm×200 nm, and an upper electrode is formed thereon to form a magnetoresistive element, and to measure the MR value of the magnetoresistive element.

In Samples 21 to 29 formed in this manner, the total thickness of each Heusler alloy layer is 5 nm. For example, Sample 21 is a CFMS film having a thickness of 5 nm, and Sample 23 is a multilayer film having a thickness of 5 nm, obtained by stacking, five times, a CFMS layer having a thickness of 0.5 nm and a CFMG layer having a thickness of 0.5 nm to have a thickness of 1 nm. Samples 24 and 26 are Heusler alloy films in which the Si concentration is high near surfaces and the Ge concentration is high in the internal portion. Sample 25 is a Heusler alloy film in which the Ge concentration is high near surfaces and the Si concentration is high in the internal portion. The experimental result of the magnetoresistive elements shown in FIG. 7 indicates that a magnetoresistive element including any of Sample 24 or 26 has a better magnetoresistance effect than the magnetoresistive element including Sample 25. The reason for this is considered to be that a multilayer film having a high concentration of Si near the interfaces with the base layer and the intermediate layer has a better heat resistance and is better capable of suppressing the film deterioration than a multilayer film having a high concentration of Ge near the interfaces. Such a multilayer film fully provides magnetoresistance effect characteristics. The magnetoresistance effect becomes greater if the magnetoresistive element is formed by using Sample 24 or 26 rather than Sample 21, 22, or 27. The reason for this is considered to be that if a CFMG film, the heat resistance of which is not so good, but ordered crystal of which can be easily obtained, is sandwiched by CFMS films having a high heat resistance, the heat resistance of the CFMG film can be improved, and the ordering of the CFMS film is accelerated by the CFMG film. Samples 28 and 29 are obtained by stacking CFMS layers each having a thickness of 0.125 nm and CFMG layers each having a thickness of 0.25 nm. The magnetoresistive elements including Samples 28 and 29 show a magnetoresistance effect greater than that of the magnetoresistive element including Sample 23 in which 0.5-nm layers are stacked. From the fact that the saturation magnetization of the multilayer films including layers each having a thickness of 0.125 nm or 0.25 nm is greater than that of the multilayer film including layers each having a thickness of 0.5 nm in the experimental result of the magnetic characteristics shown in FIG. 1, the reason for this is considered to be that the ordering of CFMS is accelerated by CFMG if very thin CFMS layers and very thin CFMG layers are adjacent to each other.

Furthermore, from FIG. 7, it can be understood that the MR values of the [CFMS/CFMG] multilayer films are in a highest range in each heat-treatment temperature. Specifically, the MR value of the [CFMS/CFMG] multilayer film without any heat treatment is about the same as that of a monolayer film heat-treated at a temperature of 290° C. The MR value consistently increases as the temperature in the heat treatment increases up to 350° C.

From the experimental results shown in FIGS. 1 to 6, it can be understood that the ordering of Heusler alloy films in a multilayer film starts before a heat treatment, and as the temperature in the heat treatment increases, the ordering is accelerated to increase the MR value. It can also be understood that since the heat resistance of the multilayer film is good, the MR value is not decreased by a heat treatment at a temperature of 350° C. On the other hand, the MR value of the CFMG film at a temperature of 350° C. is lower than that at a temperature of 290° C. It can be understood that the decrease in the MR value is caused by the degradation of the CFMG Heusler alloy film since it can be expected from the experimental results shown in FIGS. 1 to 6 that the coercive force Hc of the CFMG film increases after a heat treatment at a temperature of 350° C. The experimental result shown in FIG. 7 clearly indicates the MR-value-increasing effect of a multilayer film obtained by alternately stacking Heusler alloy layers.

Next, a method of manufacturing a [CFMS/CFMG] multilayer film will be described with reference to FIG. 8. First, a base layer is deposited on a substrate (step S1 of FIG. 8). The base layer has either a multilayer structure (Ta/Cu) including a Ta layer and a Cu layer formed on the Ta layer, or a multilayer structure $(Ta/Cu/Fe_{50}Co_{50})$ in which a $Fe_{50}Co_{50}$ is formed on the Ta/Cu structure. If the multilayer film is applied to a reproducing head, a substrate on which a NiFe magnetic shield layer is formed is used. Several structures of the substrate and the base layer can be selected depending on which device includes the multilayer film.

Figure 8:
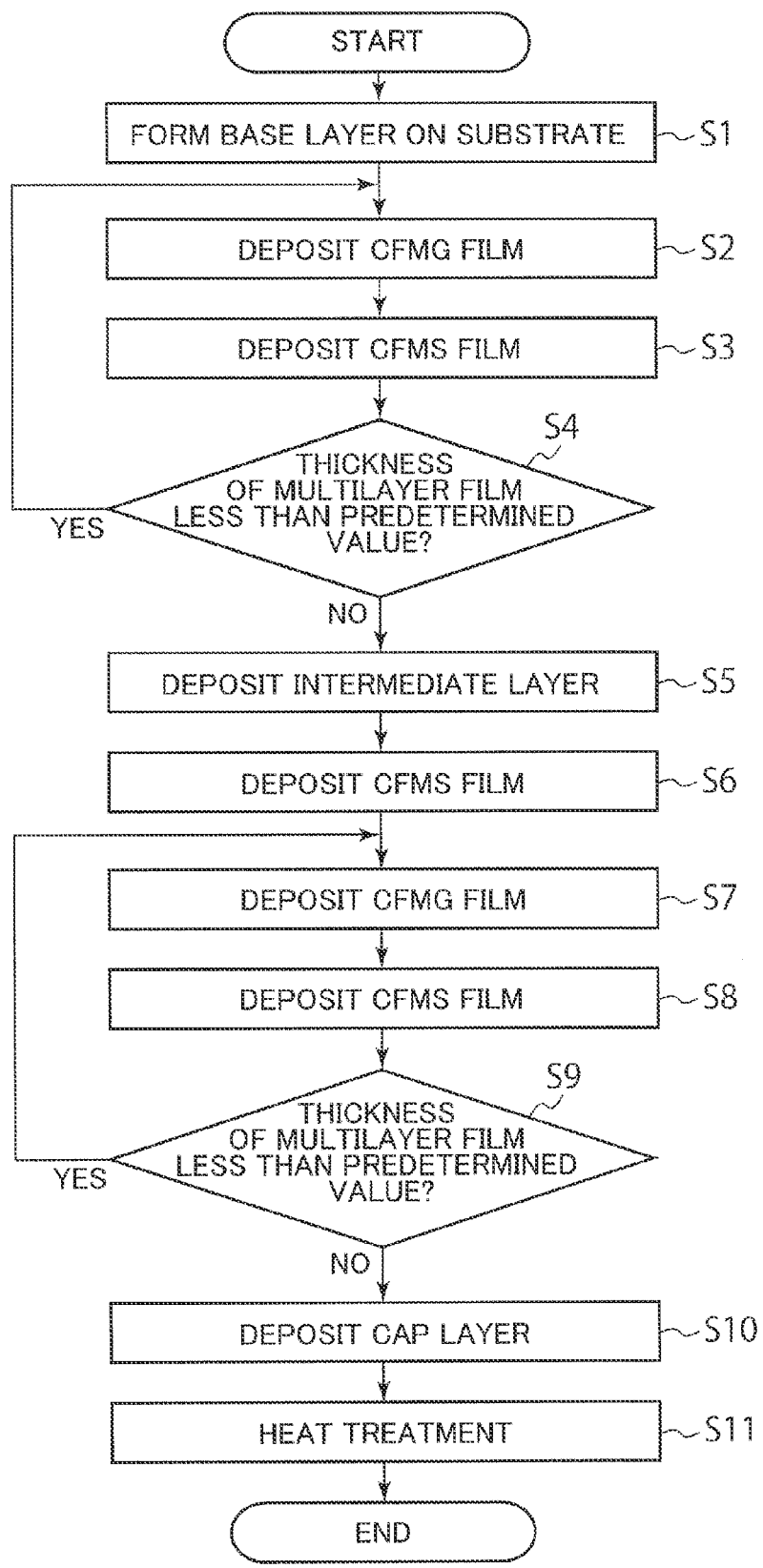
FIG. 8 is a flow chart for explaining a method of manufacturing a [CFMS/CFMG] multilayer film.

Next, a CFMG film is formed on the base layer (step S2 of FIG. 8). The deposition rate of the CFMG film is, for example, 0.0550 nm/sec.

Thereafter, a CFMS film is formed on the CFMG film (step S3 of FIG. 8). The deposition rate of the CFMS film is, for example, 0.0417 nm/sec.

Then, whether the thickness of the multilayer film is less than a predetermined value is determined (step S4), and if so, the process returns to step S2 to deposit a CFMG film and repeat steps S3 and S4. If the thickness of the multilayer film is equal to or more than the predetermined value, an intermediate layer of, for example, Cu, is formed (step S5).

Next, a CFMS film is formed on the intermediate layer (step S6). Subsequently, a CFMG film is formed (step S7 of FIG. 8). Thereafter, a CFMS film is formed on the CFMG film (step S8 of FIG. 8). Then, whether the thickness of the multilayer film on the intermediate layer is less than a predetermined value is determined (step S9), and if so, the process returns to step S7 to form a CFMG film and repeat steps S8 and S9. If the thickness of the multilayer film is equal to or more than the predetermined value, a cap layer is formed (step S10). A multilayer structure Ta/Cu or a multilayer structure Ta/Cu/Fe$_{50}$Co$_{50}$ is used as the cap layer. The cap structure can be changed depending on which device it is applied to.

The process from step S1 to step S10 is performed by, for example, a DC magnetron sputtering apparatus. The layers are deposited under the base pressure condition of less than $2\times10^{-6}$Pa, for example 0.27Pa, in an Ar gas atmosphere. The sputtering gas pressure is preferably low to form a dense film with fewer defects. The deposition power of the CFMS film and the CFMG film is, for example, 100 or 50 W, and the deposition power of the base layer and the cap layer is, for example, 100 W. When the layers are deposited, the substrate is preferably heated at a temperature in a range of 100 to 300° C. in order to accelerate the ordering of Heusler alloys, to increase the saturation magnetic flux density, and to increase the MR ratio.

After the cap layer is formed, the workpiece is taken out of the DC magnetron sputtering apparatus and heat-treated in vacuum (for example, about $10^{-4}$Pa).

Examples of the magnetic layers needed for achieving a high MR ratio that is a key to the following embodiments have been described in detail. How magnetoresistive elements including such magnetic layers are applied to devices will then be described below as the embodiments.

(First Embodiment)

A magnetic head according to the first embodiment will be described with reference to FIG. 9. The magnetic head according to the first embodiment includes a reproducing unit, which is shown in FIG. 9. FIG. 9 is a plan view of the reproducing unit 1 viewed from a magnetic recording medium, i.e. from an air bearing surface (hereinafter also referred to as the "ABS"). In FIG. 9, a direction from the reproducing unit 1 to a magnetic recording medium that is not shown is denoted by an "x direction," a track width direction of the magnetic recording medium is denoted by a "y direction," and a track length direction of the magnetic recording medium is denoted by a "z direction." The reproducing unit 1 includes a magnetoresistive film (hereinafter also referred to as the "MR film") 10 having a multilayer structure of magnetic materials with a magnetoresistance effect, and layers of magnetic shields 21, 22 disposed on both sides of the MR film 10. The MR film 10 has a structure obtained by stacking a base layer 11, a magnetic layer 12, intermediate layer 13 of a nonmagnetic material, a magnetic layer 14, and a cap layer 15 in this order. The magnetic shields 21, 22 also serve as electrodes for passing a current through the MR film 10. Thus, the reproducing unit 1 functions as a magnetoresistive element. Also in the second and third embodiments described later, the reproducing unit functions as a magnetoresistive element. In the first embodiment, side shields 23 are disposed on end portions in the track width direction (y direction) of the MR film 10 via insulating layers that are not shown.

The base layer 11 is formed of a nonmagnetic metal such as Ta, Ru, and Cu. The base layer 11 may also be formed of layers of a plurality of materials, such as Ta/Cu and Ta/Ru.

The magnetic alloys shown in FIGS. 1 to 7 are used to from the magnetic layers 12, 14. As can be understood from FIG. 1, Heusler alloy multilayer films each formed by alternately stacking CFMS films and CFMG film with the thickness of each CFMS film being as thin as a monolayer level to 1.5 nm, for example, are used as the magnetic layers 12, 14. Furthermore, as can be understood from FIG. 2, the magnetic layers 12, 14 have a structure in which a Heusler alloy film that does not show a high resistance to heat is sandwiched by Heusler alloy films that show a high resistance to heat. Moreover, as can be understood from FIGS. 3 and 4, multilayer films each including, for example, a Heusler alloy layer containing Si and a Heusler alloy layer containing Ge are used as the magnetic layers 12, 14. Further, as can be understood from FIG. 5, multilayer films each including, for example, a CFMG Heusler alloy layer in which the Ge concentration is more than 15% and less than 35% and a CFMS layer are used as the magnetic layers 12, 14. Still further, as can be understood from FIG. 6, even if the composition ratios in the A-site elements are different from those of a Heusler alloy, multilayer structures including magnetic alloy films containing Si or Ge can be used as the magnetic layers 12, 14. Furthermore, as can be understood from FIG. 7, [CFMS/CFMG] multilayer films are used as the magnetic layers 12, 14. The aforementioned multilayer films with a half of Si constituting CoFeSi being substituted by Al, or with a half of Ge constituting CoFeGe being substituted by Ga can also be used.

In the reproducing unit 1 of the first embodiment, both the magnetic layers 12, 14 serve as free layers to detect a magnetic field from the magnetic recording medium. Specifically, in response to the magnetic field from the magnetic recording medium, an angle formed by the magnetization direction of the magnetic layer 12 and the magnetization direction of the magnetic layer 14 changes, which changes the electric resistance of the reproducing unit 1. The change in the electric resistance is detected by passing a constant current between the magnetic shields 21 and 22 and measuring a voltage therebetween, or applying a constant voltage between the magnetic shields 21 and 22, and measuring the current flowing therebetween.

The thickness of the magnetic layers 12, 14 is preferably from 3 to 8 nm. If a high-resolution reproducing is required, the thickness of the magnetic layers 12, 14 is preferably decreased to decrease the distance between the layers of magnetic shields 21, 22. For example, a multilayer structure having a thickness of 3 nm, including a Ta layer having a thickness of 2 nm and a Cu layer having a thickness of 1 nm, is used as the base layer 11, a Cu layer having a thickness of 2 nm is used as the intermediate layer 13, and a multilayer structure having a thickness of 3 nm including a Cu layer having a thickness of 1 nm and a Ta layer having a thickness of 2 nm is used as the cap layer 15. If the thickness of each of the magnetic layers 12 and 14 is set to be 4 nm, a narrow gap length (a distance of the gap between the layer of magnetic shield 21 and the layer of magnetic shield 22) of 16 nm can be achieved, and a high resolution required for the reproducing of data with the recording density of 2 to 4 Tb/in$^2$ can be obtained.

If the thickness of the magnetic layers 12, 14 becomes less than 3 nm, a reduction in the magnetoresistance change ratio (MR ratio) and an increase in magnetic noise caused by thermal fluctuation become considerable, which makes it difficult to reproduce data with a high signal-to-noise ratio. If the thickness of the magnetic layers 12, 14 exceeds 8 nm, the gap length becomes about the same as that of conventional reproducing heads, 24 nm, and the same effect as that of the first embodiment can be obtained. However, this is beyond the gap length required for a reproducing head for a high recording density medium, 2 to 4Tb/in$^2$.

The intermediate layer 13 of a nonmagnetic material may be formed of a metal film of Cu or Ag, an oxide film of MgO, GaO, or ZnO, an insulating film having a fine conductive region containing a magnetic metal (such as Fe or Co) or a nonmagnetic metal (such as Cu), or a thin film of a nitride such as TiN, CrN, or TaN.

The cap layer 15 may be formed of a nonmagnetic metal such as Ta, Ru, Cu, Ag, Au, Al, or Ti.

The layers of magnetic shields 21, 22 may be formed of, for example, a NiFe alloy. The layers of magnetic shields 21, 22 also have a function as electrodes for passing a current through the MR film 10, in addition to a function of improving resolution.

As described above, according to the first embodiment, it is possible to provide a magnetic head including a magnetic layer of which the temperature for ordering crystal is low, and the resistance change rate is large.

The magnetic head according to the first embodiment may include a recording unit for recording magnetization information to a magnetic recording medium. A recording unit, which will be described as the fourth embodiment, may be used as this recording unit.

(Second Embodiment)

Figure 10:
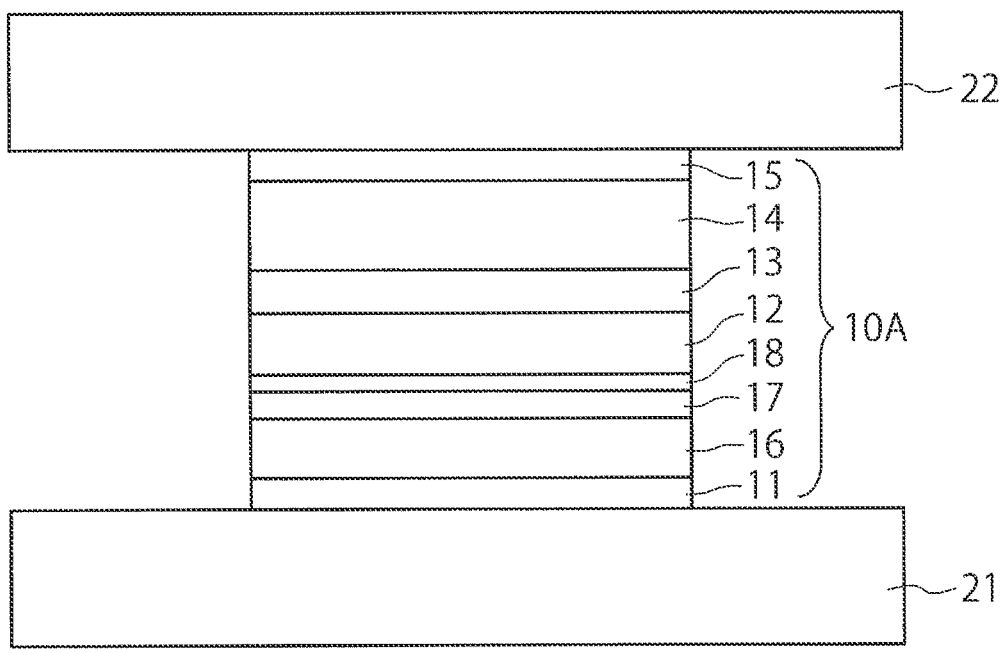
FIG. 10 is a plan view of a reproducing unit of a magnetic head according to the second embodiment.

A magnetic head according to the second embodiment will be described with reference to FIG. 10. The magnetic head according to the second embodiment includes a reproducing unit, which is shown in FIG. 10. FIG. 10 is a plan view in which the reproducing unit 1A is viewed from an air bearing surface. The reproducing unit 1A has a structure in which the MR film 10 of the reproducing unit 1 according to the first embodiment shown in FIG. 9 is replaced with an MR film 10A. The MR film 10A includes an antiferromagnetic layer 16, a magnetic layer 17, and an exchange coupling layer 18 between the base layer 11 and the magnetic layer 12 of the MR film 10. The magnetization direction of the magnetic layer 17 is fixed in one direction by the antiferromagnetic layer 16. The magnetic layer 12 and the magnetic layer 17 are exchange-coupled by the exchange coupling layer 18.

The base layer 11, the nonmagnetic intermediate layer 13, and the cap layer 15 are formed of the same materials, and have the same thicknesses as those in the first embodiment.

The antiferromagnetic layer 16 is formed of, for example, an IrMn alloy having a thickness of 5 to 7 nm. The magnetic layer 17, in which the magnetization direction is fixed, is formed of, for example, a CoFe alloy. The exchange coupling layer 18 is formed of, for example, Ru.

At least one of the magnetic layer 12 and the magnetic layer 14 is formed of a Heusler alloy described in the descriptions of the first embodiment.

A CoFe alloy layer (not shown) having a thickness of about 0.5 nm may be disposed at the interface between the magnetic layer 12 and the exchange coupling layer 18 in order to secure satisfactory exchange coupling. The thickness of the magnetic layer 12 is preferably as thin as about 2 nm, to secure strong exchange coupling for stably fixing the magnetization and to achieve a high-resolution reproduction obtained by a short distance between the upper and the lower shields. In order to achieve a sufficient level of ordering and a high MR ratio with a thickness of about 2 nm, composition modulated Heusler alloy films such as CoFeMnSi (0.3 nm)/CoFeMnGe (0.5 nm)/CoFeMnSi (0.3 nm)/CoFeMnGe (0.5 nm)/CoFeMnSi (0.3 nm) may be used. The specific Heusler alloy composition ratios are $Co_{50}Fe_{10}Mn_{15}Si_{25}$ and $Co_{50}Fe_{10}Mn_{15}Ge_{25}$.

The magnetic layer 14 of the second embodiment may have a multilayer structure including, for example, a layer of a Heusler alloy having a composition similar to that of the magnetic layer 12, a NiFe layer or a Fe layer having a thickness of 2 nm to 4 nm, and a diffusion barrier layer formed of Cu, Ta, or Ru, having a thickness of a mono-layer added by 1 nm, the NiFe layer or Fe layer having a negative magnetostriction. A Heusler alloy generally have a positive magnetostriction, but the magnetic layer 14 should have a characteristic of changing the magnetization smoothly in response to the magnetic field from a medium to have a now noise. In order to achieve this, the magnetostriction should be lowered. By disposing the NiFe layer or Fe layer having a negative magnetostriction to cancel the positive magnetostriction, a low magnetostriction can be achieved.

According to the second embodiment, it is possible to provide a magnetic head including a magnetic layer of which the temperature for ordering crystal is low, and the resistance change rate is large as in the case of the first embodiment.

The magnetic head according to the second embodiment may include a recording unit for recording magnetization information to a magnetic recording medium. A recording unit, which will be described as the fourth embodiment, may be used as this recording unit.

(Third Embodiment)

Figure 11:
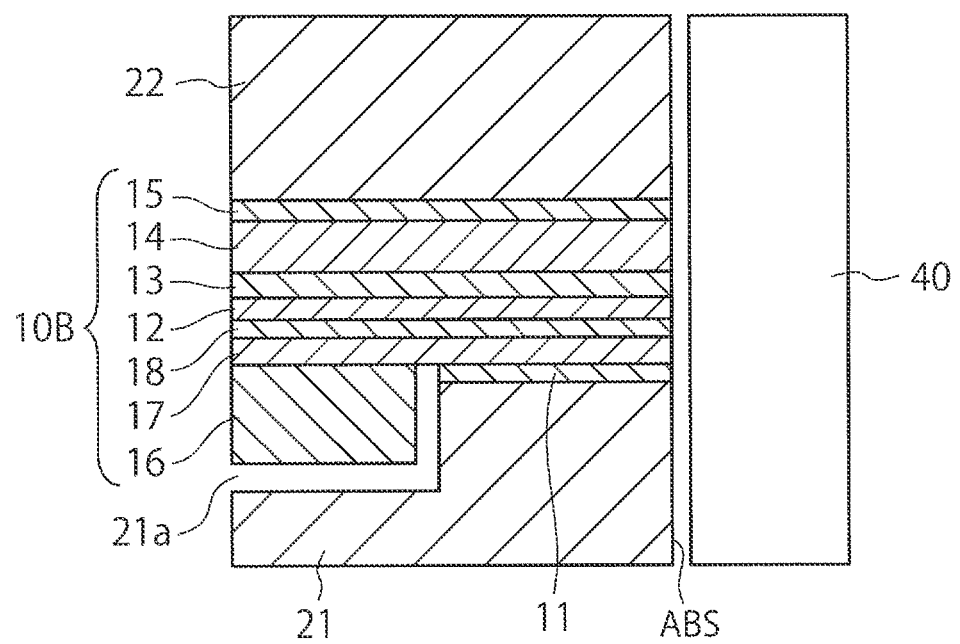
FIG. 11 is a cross-sectional view of a reproducing unit of a magnetic head according to the third embodiment.

A magnetic head according to the third embodiment will be described with reference to FIG. 11. The magnetic head of the third embodiment includes a reproducing unit. FIG. 11 shows such a reproducing unit 1B. FIG. 11 is a cross-sectional view of the reproducing unit 1B taken along a plane perpendicular to the ABS. In FIG. 11, a direction from the reproducing unit 1B to the magnetic recording medium 40 is denoted by an "x direction," a track width direction of the magnetic recording medium 40 is denoted by a "y direction," and a track length direction of the magnetic recording medium 40 is denoted by a "z direction." The reproducing unit 1B includes a magnetoresistive (hereinafter also referred to as the "MR") film 10B having a multilayer structure of magnetic materials to have the magnetoresistance effect, and layers of magnetic shields 21, 22 disposed on both sides of the MR film 10B. The layer of magnetic shield 21 has a recessed portion 21a that is located opposite to the ABS and on the side of the MR film 10B. The recessed portion 21a is located in a region about 20 to 50 nm back from the ABS.

The MR film 10A includes a base layer 11, a magnetic layer 12, an intermediate layer 13 of a nonmagnetic material, a magnetic layer 14, a cap layer 15, an antiferromagnetic layer 16, a magnetic layer 17, and an exchange coupling layer 18. The base layer 11, the magnetic layer 17, the exchange coupling layer 18, the magnetic layer 12, the intermediate layer 13, the magnetic layer 14, and the cap layer 15 are stacked in this order on a surface of the magnetic shield 21 facing the magnetic shield 22. The base layer 11 is disposed on the surface of the magnetic shield 21 facing the magnetic shield 22 except for the region of the recessed portion 21a. The multilayer structure including the magnetic layer 17, the exchange coupling layer 18, the magnetic layer 12, the intermediate layer 13, the magnetic layer 14, and the cap layer 15 is disposed on the base layer 11 and also extends over the recessed portion 21a of the magnetic shield 21. The antiferromagnetic layer 16 is formed in the recessed portion 21a to be close to the magnetic layer 17 so as to fix the magnetization direction of the magnetic layer 17 in a uniaxial direction. An insulating film (not shown) is disposed between the antiferromagnetic layer 16 and the magnetic shield 21.

The materials of the base layer 11, the magnetic layer 17, the exchange coupling layer 18, the magnetic layer 12, the intermediate layer 13, the magnetic layer 14, the cap layer 15, and the antiferromagnetic layer 16 are the same as those of the second embodiment.

The distance between the magnetic shields 21, 22 of the reproducing unit 1B in the third embodiment can be reduced as compared to that of the reproducing unit 1A in the second embodiment. Thus, the reproducing resolution is improved. Since the antiferromagnetic layer 16 is located at a distance from the magnetic recording medium 40, the magnetization of the magnetic layer 12 can be fixed and maintained.

According to the third embodiment, it is possible to provide a magnetic head including a magnetic layer of which the temperature for ordering crystal is low, and the resistance change rate is large as in the case of the second embodiment.

The magnetic head according to the third embodiment may include a recording unit for recording magnetization information to a magnetic recording medium. A recording unit, which will be described as the fourth embodiment, may be used as this recording unit.

The cases where a magnetoresistive element is applied to a reproducing unit of a magnetic head have been described in detail in the first to the third embodiment. The effects obtained from the first to the third embodiments are to accelerate the ordering of Heusler alloy, and to increase the MR ratio. Accordingly, the first to the third embodiments can be applied to various spintronics devices in addition to magnetic heads. For example, a Heusler alloy having a high MR ratio may be applied to such devices as magnetic oscillation devices, spin torque oscillators (STOs) for microwave-assisted magnetic heads, MRAMs, and spin transistors. A case where a magnetoresistive element is applied to a STO of a microwave-assisted magnetic head will be described below as the fourth embodiment.

(Fourth Embodiment)

Figure 12:
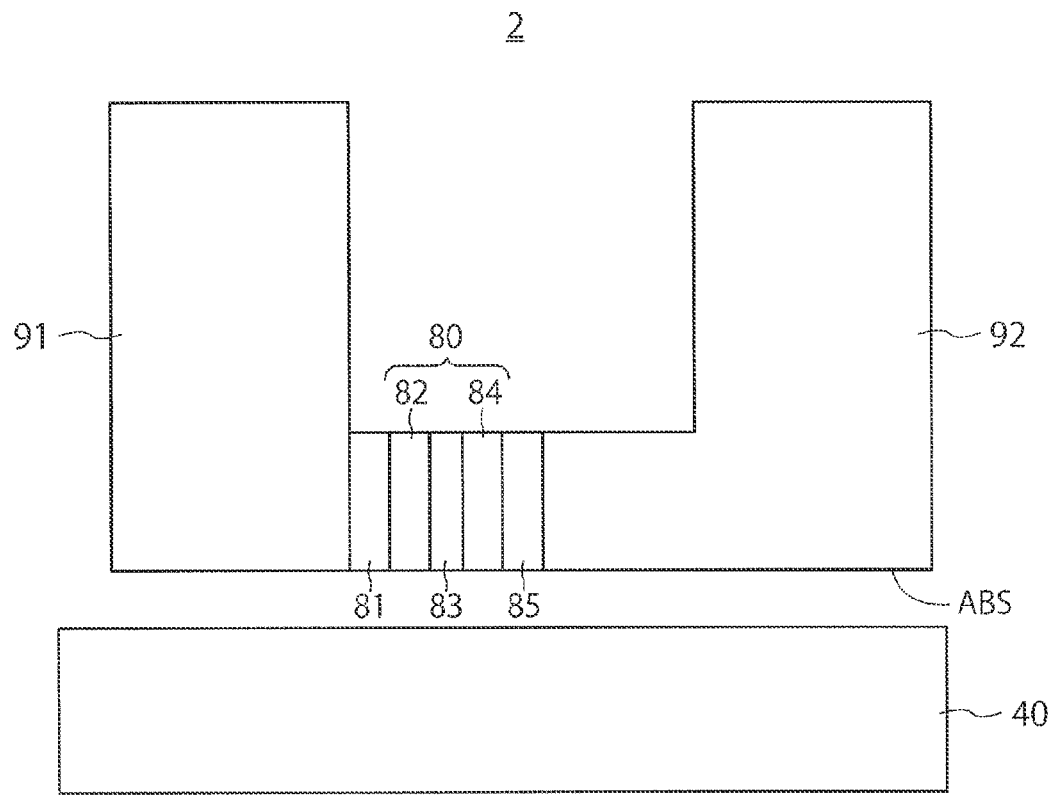
FIG. 12 is a cross-sectional view of a recording unit of a magnetic head according to the fourth embodiment.

FIG. 12 shows a microwave-assisted magnetic head according to the fourth embodiment. The microwave-assisted magnetic head according to the fourth embodiment includes a recording unit 2. FIG. 12 is a cross-sectional view of the recording unit 2. In FIG. 12, a direction from the recording unit 2 to a magnetic recording medium 40 is denoted by an "x direction," a track width direction of the magnetic recording medium 40 is denoted by a "y direction," and a track length direction of the magnetic recording medium 40 is denoted by a "z direction." The recording unit 2 includes a recording magnetic pole 91, a magnetic shield 92, and a spin torque oscillator 80 disposed between the recording magnetic pole 91 and the magnetic shield 92.

The spin torque oscillator 80 has a multilayer structure obtained by stacking a base layer 81, a spin transfer layer 82 having a perpendicular magnetization, an intermediate layer 83 of a nonmagnetic material, an oscillation layer 84, and a cap layer 85 in this order on the recording magnetic pole 91. A direct current is supplied to the spin torque oscillator 80 via the recording magnetic pole 91 and the magnetic shield 92. Then, the oscillation layer 84 oscillates due to the polarized spin introduced from the spin transfer layer 82, and a microwave-assisted magnetic field generated in the oscillation layer 84 is applied to the magnetic recording medium 40, thereby performing a microwave-assisted magnetic recording operation.

In order to oscillate the spin torque oscillator, the spin transfer layer 82 requires as large spin polarization as possible. In order to have perpendicular magnetization and large spin polarization, the spin transfer layer 82 preferably has a multilayer structure having perpendicular magnetization in which Co layers and Pt layers are alternately stacked, a multilayer structure having perpendicular magnetization in which Co layers and Pd layers are alternately stacked, or a multilayer structure having perpendicular magnetization in which Co layers and Ni layers are alternately stacked, and a composition modulated Heusler alloy layer having a thickness of as thin as 2 nm, which is described in the second embodiment, at an interface with the intermediate layer 83 of a nonmagnetic material. An example of composition modulated Heusler alloy is CoFeMnSi (0.3 nm)/CoFeMnGe (0.5 nm)/CoFeMnSi (0.3 nm)/CoFeMnGe (0.5 nm)/CoFeMnSi (0.3 nm). Specific compositions of the Heusler alloys are $Co_{50}Fe_{10}Mn_{15}Si_{25}$ and $Co_{50}Fe_{10}Mn_{15}Ge_{25}$. With such a structure, a spin transfer layer having a perpendicular magnetic field and a high spin polarization can be obtained.

The oscillation layer 84 is formed of a FeCo alloy having a large saturation magnetization in order to generate a high-frequency magnetic field. In order to facilitate the spin torque oscillation, the Gilbert damping constant of the oscillation layer 84 should be reduced. It is reported that the Gilbert damping constant in a Heusler alloy such as CoFeMnSi, the ordering thereof is accelerated by a heat treatment at a temperature of about 500° C., is considerably reduced as compared to FeCo if the ratio of Fe to Mn is about 1:1 (Appl. Phys. Lett. 94, 122504 (2009)). In principle, the Gilbert damping constant is reduced when the ordering is accelerated and the spin polarization is improved. If a Heusler alloy structure including alternately stacked CoFeMnSi layers and CoFeMnGe layers is used as the oscillation layer, the ordering can be accelerated during a heat treatment at a temperature of about 300° C. or less. In this manner, an STO capable of oscillating easily can be obtained. In order to improve the saturation magnetization of the oscillation layer 84, FeCo films and Heusler alloy films used in the first to the third embodiments may be stacked. For example, if the oscillation layer includes a multilayer structure of FeCo (3 nm)/H (2 nm)/FeCo (3 nm)/H (2 nm)/FeCo (3 nm), a low Gilbert damping constant and a high saturation magnetization (−2T) can be obtained, where H means a Heusler alloy used in the first to the third embodiments. As a result, a large high-frequency magnetic field can be generated even if the current flowing through the spin torque oscillator (STO current) is low. With the low STO current, the reliability of the spin torque oscillator can be improved.

According to the fourth embodiment, it is possible to provide a magnetic head including a magnetic layer of which the temperature for ordering crystal is low, and the resistance change rate is large as in the case of the first embodiment.

The magnetic head according to the fourth embodiment may include a reproducing unit for reproducing magnetization information from a magnetic recording medium. A reproducing unit, which is described in any of the first to the third embodiments, may be used as this reproducing unit.

(Fifth Embodiment)

A magnetic recording and reproducing apparatus according to the fifth embodiment will be described below.

The magnetic head according to any of the first to the fourth embodiments described above can be included in a recording and reproducing magnetic head assembly, for example, and implemented in a magnetic recording and reproducing apparatus. The magnetic recording and reproducing apparatus according to the fourth embodiment may have a reproducing function and both a recording function and a reproducing function.

Figure 13:
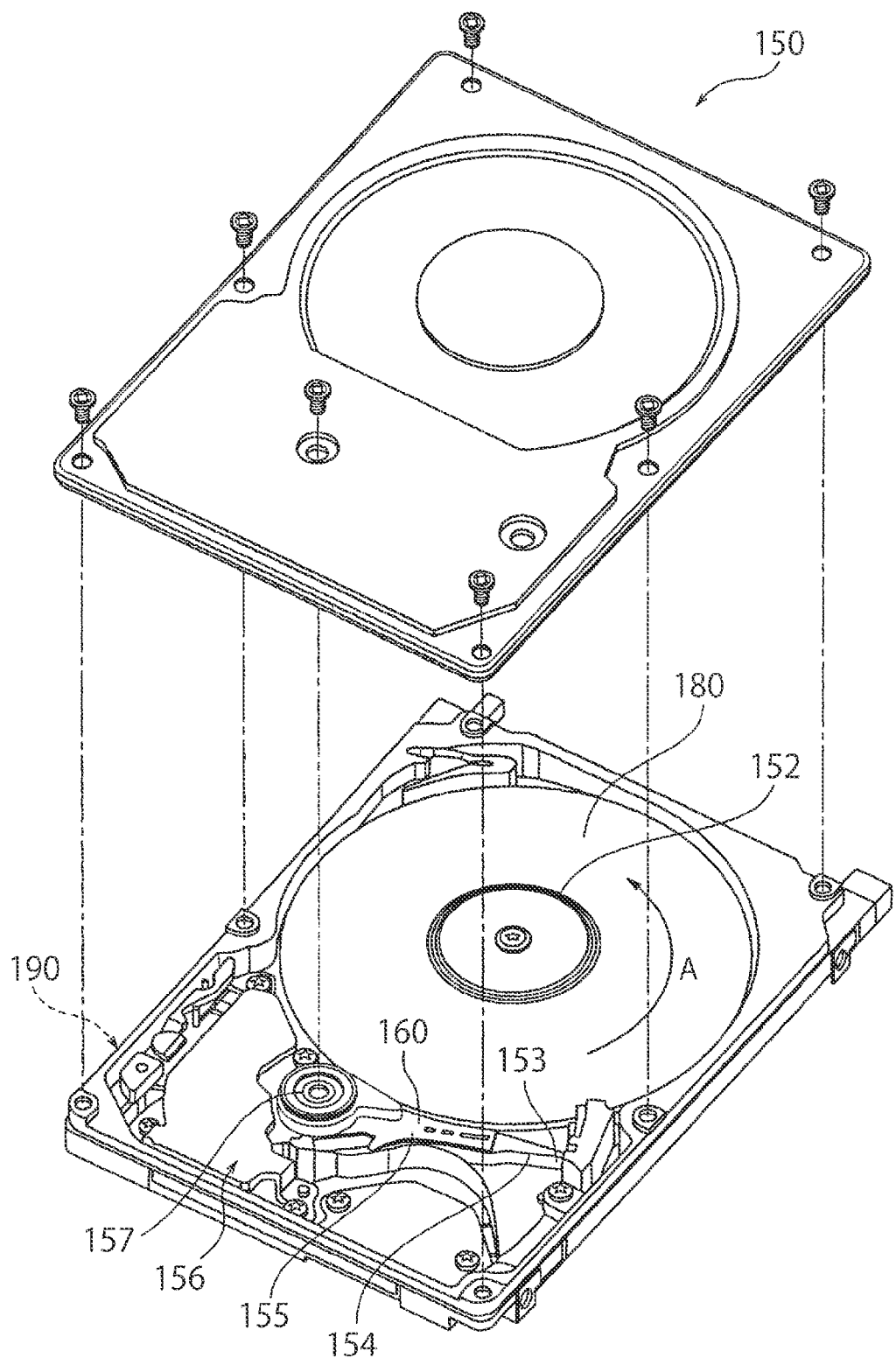
FIG. 13 is a schematic perspective view of a magnetic recording and reproducing apparatus according to the fifth embodiment.

FIG. 13 is a schematic perspective view of a magnetic recording and reproducing apparatus according to the fifth embodiment. As shown in FIG. 13, the magnetic recording and reproducing apparatus 150 according to the fifth embodiment includes a rotary actuator. In FIG. 13, a recording medium disk 180 is set to a spindle motor 152, and rotated in the direction of the arrow A by a motor (not shown) that responds to a control signal from a drive device controller (not shown). The magnetic recording and reproducing apparatus 150 according to the fifth embodiment may have a plurality of recording medium disks 180.

A head slider 153 for recording and reproducing data stored in the recording medium disk 180 is attached to an end of a suspension 154 that is in a thin-film form. The head slider 153 has, at around the end thereof, one of the magnetic heads according to the embodiments described above with the magnetic shields, for example.

When the recording medium disk 180 is rotated, the air bearing surface (ABS) of the head slider 153 is lifted and held above the surface of the recording medium disk 180 at a certain floating distance. The head slider 153 may be of so-called "contact tracking type" that contacts the recording and reproducing medium disk 180.

The suspension 154 is connected to an end of an actuator arm 155 including such parts as a bobbin part for supporting a drive coil (not shown). The other end of the actuator arm 155 is connected to a voice coil motor 156, which is a kind of linear motor. The voice coil motor 156 may include the drive coil (not shown) wound around the bobbin part of the actuator arm 155, and a magnetic circuit including a permanent magnet and a facing yoke that are arranged at both the sides of the coil to face each other.

The actuator arm 155 is supported by ball bearings (not shown) arranged at upper and lower portions of a bearing unit 157, and can be rotated and slid freely by means of the voice coil motor 156.

Figure 14:
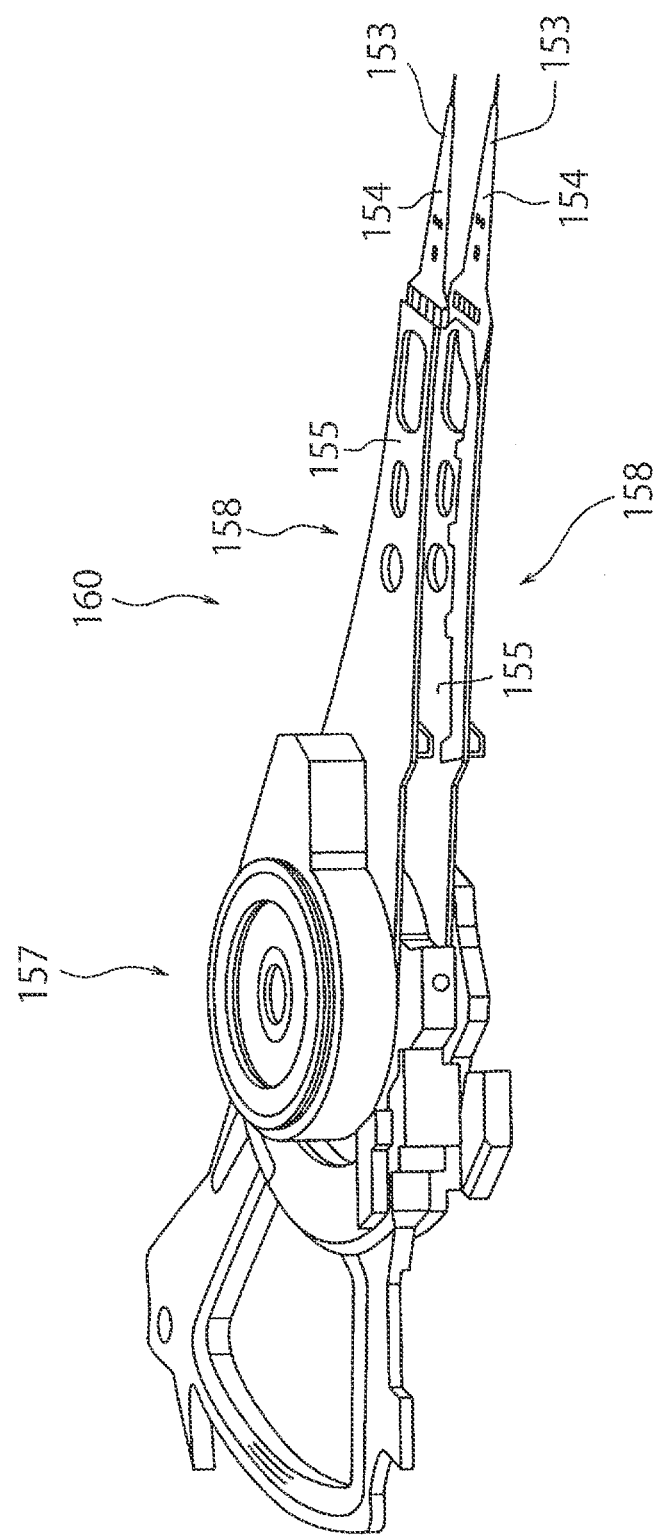
FIG. 14 is a perspective view of a head stack assembly to which a head slider is mounted.

FIG. 14 shows an example of the structure of a part of the magnetic recording and reproducing apparatus according to the fifth embodiment, and is an enlarged perspective view of a magnetic head assembly 160 from the actuator arm 155 to the end, viewed from the disk side. As shown in FIG. 14, the magnetic head assembly 160 includes the bearing unit 157, a head gimbal assembly (hereinafter referred to as the "HGA") 158 extending from the bearing unit 157, and a support frame that supports the coil of the voice coil motor and extends from the bearing unit 157 to a direction opposite to the direction of the HGA. The HGA includes the actuator arm 155 extending from the bearing unit 157, and the suspension 154 extending from the actuator arm 155.

The head slider 153 including the magnetic head according to any of the first to the fourth embodiments is attached to the tip of the suspension 154.

Thus, the magnetic head assembly 160 according to the fifth embodiment includes the magnetic head according to any of the first to the fourth embodiments, the suspension 154 for holding the magnetic head at one end thereof, and the actuator arm 155 attached to the other end of the suspension 154.

The suspension 154 includes a lead line (not shown) for writing and reading signals, which is electrically connected to respective electrodes of the magnetic recording head attached to the head slider 153. The magnetic head assembly 160 also includes an electrode pad that is not shown.

The magnetic head assembly 160 further includes a signal processing unit 190 (not shown) for writing signals to and reading signals from a magnetic recording medium using the magnetic recording head. The signal processing unit 190 is, for example, attached to the back side of the magnetic recording and reproducing apparatus 150 shown in FIG. 13. Input and output lines of the signal processing unit 190 are connected to the electrode pad, and electrically coupled to the magnetic recording head.

Thus, the magnetic recording and reproducing apparatus 150 according to the fifth embodiment includes a magnetic recording medium, a magnetic head according to any of the first to the fourth embodiments, a movable unit (movement controller) for keeping the positions of the magnetic recording medium and the magnetic head to face each other in a separating or contacting state, and causing them to move relative to each other, a position controller for adjusting the position of the magnetic head to a predetermined recording position on the magnetic recording medium, and a signal processing unit for writing signals to and reading signals from the magnetic recording medium by means of the magnetic head. The recording medium disk (magnetic disk) 180 is used as the aforementioned magnetic recording medium. The movable unit may include the head slider 153. The position controller may include the magnetic head assembly 160.

When the magnetic disk 180 is rotated, and the voice coil motor 156 is caused to rotate the actuator arm 155 to load the head slider 153 above the magnetic disk 180, the air bearing surface (ABS) of the head slider 153 attached to the magnetic head is supported above the surface of the magnetic disk 180 at a predetermined distance therefrom. In this manner, the data stored in the magnetic disk 180 can be read based on the aforementioned principle.

As described above, according to the fifth embodiment, it is possible to provide a magnetic recording and reproducing apparatus including a magnetic head with a magnetic layer of which the temperature for ordering crystal is low, and the resistance change rate is large.

A magnetoresistive element according to an embodiment may include: a magnetoresistance effect film including: a first magnetic film; a second magnetic film; and an intermediate film of a nonmagnetic material disposed between the first magnetic film and the second magnetic film, at least one of the first magnetic film and the second magnetic film being formed of a material expressed as $A_xB_{1-x}$ (65 at %≤x≤85 at %) where A is an alloy containing Co and at least one element selected from Fe and Mn, and B is an alloy containing Si or Ge, the at least one of the first magnetic film and the second magnetic film having a structure in which first layers and second layers are alternately stacked, the first layer has a higher Si concentration than the second layer, and the second layer has a higher Ge concentration than the first layer.

A method of manufacturing a magnetoresistive element according to an embodiment may include: forming a first magnetic film on a substrate; forming an intermediate film of a nonmagnetic material on the first magnetic film; and forming a second magnetic film on the intermediate film, at least one of the first magnetic film and the second magnetic film being formed of a material expressed as $A_xB_{1-x}$ (65 at %≤x≤85 at %) where A is an alloy containing Co and at least one element selected from Fe and Mn, and B is an alloy containing Si or Ge, the forming of the at least one of the first magnetic film and the second magnetic film including: forming a first layer in which a Si concentration is higher than a Ge concentration; forming a second layer, in which the Ge concentration is higher than the Si concentration, on the first layer; and forming a third layer, in which the Si concentration is higher than the Ge concentration, on the second layer.

In above the method, the forming of the first layer and the forming of the second layer may be repeated several times.

A magnetic recording and reproducing apparatus according to an embodiment may include: a magnetic recording medium; a magnetic head; a movement controller that controls movements of the magnetic recording medium and the magnetic head so that they face each other and move relative to each other in a floating state or contacting state; a position controller that controls a position of the magnetic head to be at a predetermined recording position of the magnetic recording medium; and a signal processing unit that processes a write signal to the magnetic recording medium and a read signal from the magnetic recording medium using the magnetic head.

The magnetic head may include: a first magnetic shield and a second magnetic shield, which face each other; and a magnetoresistive element disposed between the first magnetic shield and the second magnetic shield.

The magnetoresistive element may include: a magnetoresistance effect film including: a first magnetic film; a second magnetic film; and an intermediate film of a nonmagnetic material disposed between the first magnetic film and the second magnetic film, at least one of the first magnetic film and the second magnetic film being formed of a material expressed as $A_xB_{1-x}$ (65 at %≤x≤85 at %) where A is an alloy containing Co and at least one element selected from Fe and Mn, and B is an alloy containing Si or Ge, a Si concentration in the at least one of the first magnetic film and the second magnetic film decreasing and a Ge concentration increasing as a distance from the intermediate film increases.

The magnetoresistive element may include: a magnetoresistance effect film including: a first magnetic film; a second magnetic film; and an intermediate film of a nonmagnetic material disposed between the first magnetic film and the second magnetic film, at least one of the first magnetic film and the second magnetic film being formed of a material expressed as $A_xB_{1-x}$ (65 at %≤x≤85 at %) where A is an alloy containing Co and at least one element selected from Fe and Mn, and B is an alloy containing Si or Ge, the at least one of the first magnetic film and the second magnetic film having a structure in which first layers and second layers are alternately stacked, the first layer has a higher Si concentration than the second layer, and the second layer has a higher Ge concentration than the first layer.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetoresistive element comprising:
   a magnetoresistance effect film including:
      a first magnetic film;
      a second magnetic film; and
      an intermediate film of a nonmagnetic material disposed between the first magnetic film and the second magnetic film,
   at least one of the first magnetic film and the second magnetic film being formed of a material expressed as $A_xB_{1-x}$ (65 at %≤x≤85 at %) where A is an alloy containing Co and at least one element selected from Fe and Mn, and B is an alloy containing Si and Ge, a Si concentration in the at least one of the first magnetic film and the second magnetic film decreasing and a Ge concentration increasing as a distance from the intermediate film increases.

2. The magnetoresistive element according to claim 1, wherein the at least one of the first magnetic film and the second magnetic film has a structure in which first layers and second layers are alternately stacked, the first layer has a higher Si concentration than the second layer, and the second layer has a higher Ge concentration than the first layer.

3. The magnetoresistive element according to claim 2, wherein the first layer has a thickness in a range of 0.125 to 1.5 nm.

4. The magnetoresistive element according to claim 2, wherein a thickness of the second layer is more than that of the first layer.

5. A magnetic head comprising:
   a first magnetic shield and a second magnetic shield, which face each other; and
   the magnetoresistive element according to claim 1 disposed between the first magnetic shield and the second magnetic shield.

6. The magnetic head according to claim 5, further comprising an antiferromagnetic film disposed between the first magnetic shield and the second magnetic shield, the antiferromagnetic film fixing magnetization of the other of the first magnetic film and the second magnetic film.

7. The magnetic head according to claim 6, wherein:
   the magnetoresistance effect film extends in a direction from the first magnetic shield to the second magnetic shield; and
   the antiferromagnetic film is disposed near a portion to which the other of the first magnetic film and the second magnetic film extends.

8. The magnetic head according to claim 5, wherein the at least one of the first magnetic film and the second magnetic film has a structure in which first layers and second layers are alternately stacked, the first layer has a higher Si concentration than the second layer, and the second layer has a higher Ge concentration than the first layer.

9. The magnetic head according to claim 8, further comprising an antiferromagnetic film disposed between the first magnetic shield and the second magnetic shield, the antiferromagnetic film fixing magnetization of the other of the first magnetic film and the second magnetic film.

10. The magnetic head according to claim 9, wherein:
    the magnetoresistance effect film extends in a direction from the first magnetic shield to the second magnetic shield; and
    the antiferromagnetic film is disposed near a portion to which the other of the first magnetic film and the second magnetic film extends.

11. A magnetic head comprising:
    a magnetic pole;
    a magnetic shield facing the magnetic pole; and
    a spin torque oscillator disposed between the magnetic pole and the magnetic shield, the spin torque oscillator having a multilayer structure obtained by stacking a spin transfer film, an intermediate film, and an oscillation film that oscillates due to polarized spin from the spin transfer film, in this order,
    the oscillation film having a multilayer structure including a FC alloy layer and a Heusler alloy layer, the Heusler alloy layer being expressed as $A_xB_{1-x}$ (65 at %≤x≤85 at %) where A is an alloy containing Co and at least one element selected from the group consisting of Fe and Mn, and B is an alloy containing Si and Ge, composition ratios in the Heusler alloy layer being changed such that a Si concentration decreases and a Ge concentration increases as a distance from the intermediate film increases.

12. The magnetic head according to claim 11, wherein the at least one of the first magnetic film and the second magnetic film has a structure in which first layers and second layers are alternately stacked, the first layer has a higher Si concentration than the second layer, and the second layer has a higher Ge concentration than the first layer.

13. The magnetic head according to claim 12, wherein the first layer has a thickness in a range of 0.125 to 1.5 nm.

14. The magnetic head according to claim 12, wherein a thickness of the second layer is more than that of the first layer.

* * * * *